(12) United States Patent
Blednov

(10) Patent No.: US 9,692,361 B2
(45) Date of Patent: Jun. 27, 2017

(54) DOHERTY AMPLIFIER

(71) Applicant: FREESCALE SEMICONDUCTOR, INC., Austin, TX (US)

(72) Inventor: Igor Blednov, Toulouse (FR)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 14/759,202

(22) PCT Filed: Jan. 10, 2013

(86) PCT No.: PCT/IB2013/000105
§ 371 (c)(1),
(2) Date: Jul. 3, 2015

(87) PCT Pub. No.: WO2014/108716
PCT Pub. Date: Jul. 17, 2014

(65) Prior Publication Data
US 2016/0006399 A1   Jan. 7, 2016

(51) Int. Cl.
| H03F 1/02 | (2006.01) |
| H03F 3/21 | (2006.01) |
| H03F 3/193 | (2006.01) |
| H03F 3/195 | (2006.01) |
| H03F 3/24 | (2006.01) |

(52) U.S. Cl.
CPC .......... *H03F 1/0288* (2013.01); *H03F 3/193* (2013.01); *H03F 3/195* (2013.01); *H03F 3/211* (2013.01); *H03F 3/24* (2013.01); *H01L 2224/48091* (2013.01); *H01L 2224/48137* (2013.01); *H01L 2224/48472* (2013.01); *H01L 2224/49111* (2013.01); *H03F 2200/102* (2013.01);
(Continued)

(58) Field of Classification Search
USPC .......... 330/295, 124 R, 84, 286, 53
See application file for complete search history.

(56) References Cited

U.S. PATENT DOCUMENTS 5,568,086 A * 10/1996 Schuss ................. H03F 1/3223
                                                                    330/107
6,262,629 B1    7/2001 Stengel et al.
(Continued)

FOREIGN PATENT DOCUMENTS

| EP | 2 634 916 A1 | 9/2013 |
| EP | 2 698 918 A1 | 2/2014 |

OTHER PUBLICATIONS

International Search Report and Written Opinion correlating to PCT/IB2013/000105 issued on Oct. 14, 2013.

*Primary Examiner* — Hieu Nguyen

(57) ABSTRACT

A two-way Doherty amplifier for amplifying a modulated or non-modulated carrier signal, said carrier signal having a carrier frequency; wherein the Doherty amplifier comprises a first amplifier having a first amplifier output node, a second amplifier having a second amplifier output node, a combining node connected or connectable to a load, a first amplifier output line connecting the first amplifier output node to the combining node, and a second amplifier output line connecting the second amplifier output node to the combining node, and wherein the first amplifier output line has an electrical length of substantially one quarter wavelength of the carrier signal and the second amplifier output line has an electrical length of substantially one half wavelength of the carrier signal.

20 Claims, 13 Drawing Sheets

(52) U.S. Cl.
CPC .......... *H03F 2200/451* (2013.01); *H03F 2203/21106* (2013.01)

(56) References Cited

U.S. PATENT DOCUMENTS

| | | |
|---|---|---|
| 7,078,976 B2 | 7/2006 | Blednov |
| 9,209,511 B2 * | 12/2015 | Mei .......................... H01P 5/12 |
| 2005/0212602 A1 | 9/2005 | Krvavac et al. |
| 2009/0273398 A1 | 11/2009 | Yu |
| 2010/0026387 A1 | 2/2010 | Blednov |
| 2010/0188147 A1 | 7/2010 | Blednov et al. |
| 2011/0175677 A1 | 7/2011 | Jeong et al. |
| 2012/0133442 A1 | 5/2012 | Blednov |

* cited by examiner

DOHERTY AMPLIFIER

FIELD OF THE INVENTION

This invention relates to a Doherty amplifier.

BACKGROUND OF THE INVENTION

A power amplifier (PA) is a device for receiving an input signal and generating an output signal that is proportional to the input signal but has a higher amplitude. The output signal thus has a higher power than the input signal. A PA may also be referred to simply as an amplifier. The power ratio or the amplitude ratio of the output signal with respect to the input signal is known as the gain, or more specifically, as the power gain and the amplitude gain, respectively. An ideal amplifier has a gain that is independent of the power of the input signal. In practice, however, an amplifier is not able to output an arbitrarily high power. The gain of an amplifier therefore tends to become smaller with increasing input power. The power domain of the input signal for which the gain may be considered constant is known as the linear domain or linear regime. When the power of the input signal (input power) exceeds the linear domain, the amplifier is said to be saturated.

A Doherty amplifier is an amplifier that comprises a main amplifier and a peak amplifier, which are combined at input and output in parallel by, e.g., transmission lines or their lumped element equivalents. For example, the input terminal of the main amplifier may be connected to the input terminal of the peak amplifier by a transmission line having an electrical length of 90 degrees. Similarly, the output terminal of the peak amplifier may be connected to the output terminal of the main amplifier by a transmission line having an electrical length of 90 degrees. When the input power is in the linear domain of the main amplifier, the peak amplifier is switched off to save energy. The linear domain may be below an average power level of the input modulated signal. When the input power exceeds the linear domain, however, the peak amplifier is switched on to assist the main amplifier in generating the output signal. The Doherty amplifier therefore has a linear domain that is larger than both the linear domain of the main amplifier and the linear domain of the peak amplifier. The output of the main amplifier and the output of the peak amplifier may be combined in a combining node to generate the output signal of the Doherty amplifier.

An example of a conventional Doherty PA is described by making reference to FIG. 7. Ztr_in and Ztr_out are impedance transformers for matching of power devices in a required frequency band. They may have a required transformation ratio of up to 250 times for Ztr_in and above fifty times for Ztr_out, for example, to match, e.g., a 100 Watt (W) power device to standard 50 Ohm. A significant phase shift of internal matching structures inside the high power RF device, which may generally be greater than 70°, may lead to a situation where the resulting impedance transformer Ztr_out may have an overall electrical length much greater than 90°, and Ztr_out cannot be used as a Doherty combiner, too. Therefore, in order to provide a proper load modulation effect at the output of the main amplifier, the designer of such a Doherty amplifier may use a 180 degrees matching structure. Such a high transformation ratio and large electrical length of resulting Ztr_out together with an electrical length of 50 Ohm impedance inverter, e.g., 90°/Zo, as in FIG. 7, may limit the relative operational frequency band of the Doherty amplifier to about five to seven percent for Doherty amplifiers with an output power Pout greater than, e.g., 120 W.

An additional limitation of the bandwidth may be caused by dynamic load line modulation at the output of the main device, which may also introduce power dependant phase distortions (AM-PM). These may be considered as non-linear effects, and they may require additional supply energy, expensive Digital-Pre-Distortions (DPD) equipment and software to linearize the Doherty performance to the <−60 dBc level.

The circuitry for combining the output signals of the main amplifier and the peak amplifier is a 90° transmission line or lumped element equivalent having a specific characteristic impedance, referred to as a Doherty combiner. Due to demand of Mobile Communication industry for wideband, low cost, small size and highly efficient amplifiers providing excellent repeatability of parameters, the lumped element equivalents of transmission lines may be more suitable for the integration of Doherty PA. Another reason is that low-pass prototype equivalents of a transmission line may provide additional and very important advantages over a distributed line, such as:

1) a much wider range of the available characteristic impedance Zo of, e.g. 1 to 150 Ohms, at very compact physical dimensions, which also on top of that may depend very little on the operational frequency band, and;

2) harmonic rejection in the output signal of the device, allowing for a better linearity of PA.

Examples of such lumped element Doherty combiners are described in US patent publication U.S. Pat. No. 7,078,976 B2 and US patent application publication US 2010/0026387 A1 ('387), for example. Document '387 notably suggests applying a phase shift of only 90° to the main amplifier output signal before the main amplifier output signal and the peak amplifier output signal are combined, using a lumped element line. This may allow to realize the largest bandwidth of Doherty amplifier operation. A bandwidth greater than 30% may thus be achieved, at least in theory. Document '387 also suggests that distributed transmission lines may be very limited in the range of realizable Zo, which may be in the range of about 12 to 100 Ohms. When Zo is less than, e.g., 10 Ohms, the aspect ratio, i.e., the ratio length to width, of distributed transmission line on a printed circuit board (PCB) may be too small, which may give rise to electro-magnetic (EM) waves with higher propagation modes in the transmission line.

Traditional high power Doherty amplifiers use, e.g., RF semiconductor power devices, which may comprise a package with input and output terminals, so called leads, and active semiconductor dies with internal matching structures or impedance transformers arranged inside the package. The package may provide mechanical strength, protection from the environment and heat dissipation, which may be up to, e.g., 200% of the maximal output RF power level of the device.

There are several issues related to the traditional packaged devices and traditional Doherty amplifier architecture are limiting an instant operational RF bandwidth, which is a parameter of great demand from modern mobile communication systems like, e.g., 4G/Long Term Evolution (LTE).

A first issue is related to internal design of traditional power devices, where the active dies are connected to the output leads by bond wires, creating parasitic inductance. This inductance may prevent direct access to the active die output or even an internal channel, the so called "voltage controlled current source". According to theory, direct access to the current source of the power device may allow for the largest bandwidth of Doherty amplification, as proposed in U.S. Pat. No. 7,078,976 B2, where a lumped element Doherty combiner is connected directly to the current source of a power device die inside the package. A parasitic inductance between the active die and the device output terminal or lead may therefore degrade the performance of the Doherty amplifier, because it may be impossible to remove this inductance or to include it as part of the traditional Doherty combiner approach.

Secondly, when a very high power RF device, e.g., having a power greater than >200 W, several active dies of a large periphery, e.g., Wg≥100 mm, may be arranged inside a standard package with properly designed and integrated power distribution and matching networks at the input and the output of every die. If power distribution along the internal structure of the power device is not uniform, the device may become unstable and exhibit poor linearity, and lack ruggedness and reliability. Additionally, requirements for Doherty amplification friendliness may need to be fulfilled, because the designer of the Doherty amplifier may be unable to change the internal device structure to better fit for the required performance.

As mentioned above, the Doherty operational frequency bandwidth may further be affected by a power dependant phase characteristic and group delay of the main amplifier, which may be caused by a modulation of the impedance transformation at the output of the main device. This can be a fundamental issue as it is caused by the principal mechanism of the Doherty amplification concept. The group delay τ may be defined as the derivative of the phase φ characteristic versus the angular frequency ω:

$$\tau(\omega) = \frac{\partial \varphi}{\partial \omega}$$

According to circuit theory, the quality of impedance matching may be expressed through a reflection coefficient Γ so, impedance transformation is related to phase of the signal as in Equation 1, where ZL is a power dependant load impedance to which an impedance transformer or inverter is connected. The larger the Zo/ZL ratio, the less bandwidth of effective matching is available according to (2). The effect is similar to the effect of quality factor Q of a resonance LC network on the phase characteristic and bandwidth. As a result, the Q-factor, amplitude and phase frequency response of the network behind the main amplifier may be affected by the variable power dependant impedance transformation ratio, caused by the signal delivered by the peak device to the common load or to the combining point of the Doherty amplifier.

$$|\Gamma| = \cos\theta \frac{Z_L - Z_0}{2\sqrt{Z_L Z_0}} \quad (1)$$

$$\frac{\Delta f}{f_0} = 2 - \frac{4}{\pi}\cos^{-1}\left[\frac{\Gamma_m}{\sqrt{1-\Gamma_m^2}} \cdot \frac{2\sqrt{Z_0 Z_L}}{|Z_L - Z_0|}\right] \quad (2)$$

The impedance transformation ratio of the output network and thus the operational bandwidth of the main amplifier and its phase characteristic frequency response become power dependant due to a load modulation effect at the output of main device according to Equation 2. A simulation of this effect is presented in FIGS. 8, 9 and 10. It can be observed that the higher the Z transformation is (see FIGS. 8, 9, and 10), the more distortion of phase and group delay characteristic may be observed in the required frequency band. So, due to operation with a variable transformation ratio of the output network of main amplifier and the existing variable impedance mismatch in it, the electromagnetic wave of the amplified signal may move forward and be reflected backward in some portion expressed by (1). When combined at the output of the amplifier or power device represented by a voltage controlled current source, at each frequency of operational bandwidth the phase and amplitude of these two signals, i.e., the forward and the reflected signals may depend in the Doherty amplifier also on the instant power level, which may affect linearity of the phase characteristic of the amplifier for each current power level. The resulting AM-PM characteristic of the Doherty amplifier or device may thus become different at different frequencies of Doherty operation. But uniformity of AM-PM versus frequency of operation is one of the primary parameter of state-of-the-art Doherty PAs, as it may limit the operational bandwidth and linearization capability. According to latest requirements for power amplifiers operating in 4G/LTE mobile base stations, their phase characteristic deviation from the linear one in operational bandwidth must be less than 2°, otherwise linearization of such a power amplifier with a Digital Pre-Distortion (DPD) system may be problematic.

FIG. 8 shows a graph of the reflection coefficient as a function of the phase shift of the signal passing through the impedance transformer Ztr_out at the output of the main amplifier for different transformation ratios in the range of 1 to 50 connected as shown in FIG. 7.

FIG. 9 shows a graph of the same reflection coefficient as a function of the relative frequency deviation of the signal passing through the impedance transformer for different transformation ratios in the range of 1 to 50 as a demonstration of a bandwidth limiting effect of output matching Ztr_out of main device.

FIG. 10 illustrates an example of phase and group delay frequency response non-linear distortions ("unwrap(phase(S (1,2)))" and "S.delay(2,1)") for impedance transformation ratios of 1, 2, 3, and 5 (thick line), respectively introduced by the impedance inverter, or by the Doherty combiner, at the output terminal of the main amplifier, which may occur along power variation delivered by the peak amplifier according to the basic mechanism of the Doherty amplification principle. It is a clear frequency band degradation with an increase of the impedance modulation ratio.

At 10% of the frequency offset from the center of bandwidth (see FIG. 10), at a transformation ratio of 3:1, a phase deviation from a linear response may achieve about 7°. It means that the AM-PM amplitude of the Doherty amplifier made of, e.g., ideal distributed transmission lines, may be expected to be about 7° larger or, depending on the Doherty architecture, smaller on the side than in the center of the frequency band. In contrast, a mobile BTS multi-carrier PA may be required to have a phase characteristic that deviates by less than 2° from linear in the operational bandwidth.

The time delay Tg of the signal passing through the network having resonance at a frequency fo and a quality factor Q may be estimated as $$Tg \sim \frac{Q}{\pi fo} \quad (3)$$

An ideal distributed transmission line impedance inverter as a Doherty combiner (90°/Zo in FIG. 7) introduces no amplitude or phase response distortions at the peak power level of the Doherty amplifier, where the source and the load impedances are equal to the characteristic impedance of the impedance inverter as Zs=Zl=Zo (e.g., ZO=50 Ohms), where the quality factor Q of this system is equal to 1. At the peak power level, phase and amplitude response distortions of the Doherty amplifier may thus be introduced by the impedance transformer Ztr_out, because Doherty combiner is matched to 50 Ohms at both sides, while at back-off power level below average its contribution to the Doherty amplifier non-linearity of phase and amplitude response versus frequency is maximum. When an impedance variation occurs at Zl of the Doherty amplifier, and also at the output of the main amplifier, caused by the signal delivered by the peak device in the range between the average power level and the peak power level of Doherty, then Q≠1 and Zo≠Zs≠Zl. The quality factor Q of the main amplifier output network may thus become a function of the power delivered by the peak device and may vary about 2 times for a symmetrical Doherty amplifier and up to, e.g., >3 times for an asymmetrical 2:1 Doherty configuration. An ideal impedance inverter may be represented by and behave more like a resonator with some effective variable quality factor Q, e.g., as presented in FIG. 10, which may define the frequency bandwidth of the signal which may pass through the output network of the main amplifier to the Doherty load without significant distortions. Accordingly, the time delay of the signal may become variable with respect to both the power of the peak device and the Q factor as expressed by formula (3). As a result of this effect, the wideband signal which passes through the output network of the main device to the load may suffer from time propagation distortions, and the signal arriving at the load of the Doherty amplifier is not the same as the signal delivered by the output of the main device, distortion of which may depend on the power level or amplitude of the amplified signal. If presented in the time domain, this signal may already have a different shape, which will be different for a different power level, and not because of power saturation of active device, but because of different propagation times for different frequencies of the band. To the best knowledge of the inventors, this effect which may occur in a Doherty amplifier has not been described before.

The solution presented below addresses the Doherty amplifier bandwidth. It may include: 1) improving the matching configuration of the Doherty output combiner and 2) minimizing the power dependency of phase characteristic and group delay of the main and peak amplifiers.

FIG. 11 illustrates the simplest correcting LCR network example and FIG. 12 the group delay and phase characteristics in the band for the impedance inverter and corrector.

FIG. 12 shows, by way of an example, the characteristics of distortions of phase, cf. "unwrap(phase(S(1,2)))" and delay, cf. S.delay(2,1), in the frequency band created by an ideal inverter as a Doherty combiner at 3:1 load modulation (bold lines) and also correction characteristics (thin lines of an exemplary parallel LCR, as a corrector circuit, on the same plot. To correct properly, they may exhibit opposite trends but the same value at every power level. When such a LCR corrector is connected in series to the input of the main amplifier, it may be able to correct phase distortions in the back-off power range below the average power level at high impedance of the main device load built of ideal transmission lines. When the power level of the Doherty amplifier exceeds the average power P, the value of the resistance R in the LCR may be expected to drop to R=0 at peak power level, where the correction effect of the corrector will be minimal or close to zero. If R is replaced, for example, by a linear voltage dependent resistor, or by a channel of a field effect transistor (FET) controlled by, e.g., an envelope signal, the group delay distortion can be corrected by an envelope or so called base-band modulation signal of a very low power level, which will not affect the overall power efficiency of such a Doherty amplifier.

A similar phase or group delay distortion correction effect may be achieved by a series RLC network, e.g., as a dual to the one described above, connected in parallel to the input of the main amplifier, where the FET can be connected as a series or parallel component to the RLC, providing the required dynamic Q-factor and phase characteristic deviation.

To control the R value, a radio frequency (RF) envelope detector may be required, which can be used for R value control along the power level.

FIG. 13 shows a Doherty amplifier architecture that has been modified accordingly, allowing a dynamic linearization effect for phase frequency response and AM-PM distortions over the required wide frequency band. The figure includes a Zcorr line of a certain electrical length at the input of the peak amplifier, to compensate for the additional delay which may be introduced by the RLC corrector at the input of the main amplifier.

It should be mentioned here that in case of lumped element equivalent matching structures which may be used for the purpose of integration at the output of the main amplifier instead of distributed transmission lines and also different matching configuration using, for example, a high-pass or band-pass filter prototype instead of, e.g., a low-pass prototype configuration, the frequency response and the impedance transformation properties may be different, so the correcting network required at the input of the main device may be different too. Expression (4) represents the relation between the group delay Tg and the cut-off frequency Fc of the Low-Pass filter of the prototype network and the same for a band-pass network (5) having bandwidth BW:

$$Tg = \frac{1}{4\pi Fc} \quad (4)$$

$$Tg = \frac{1}{2\pi BW} \quad (5)$$

SUMMARY OF THE INVENTION

The present invention provides a Doherty amplifier as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Ele- FIG. 1 schematically shows an example of an embodiment of a Doherty amplifier output.

DETAILED DESCRIPTION OF THE PREFERRED EMBODIMENTS

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Figure 1:
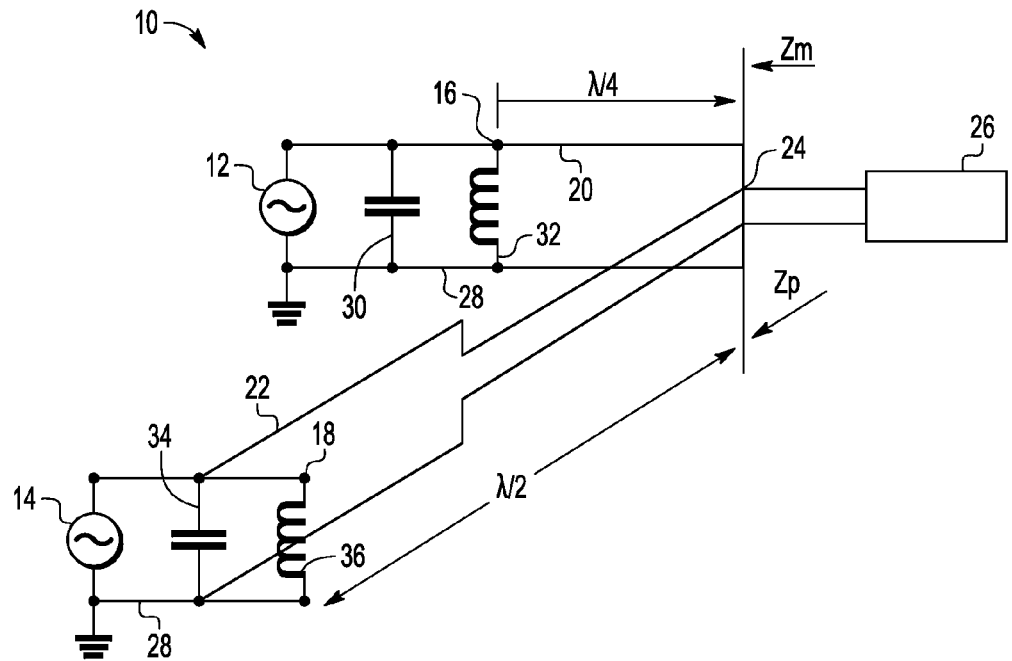

FIG. 1 schematically shows an output Doherty combiner network example of a two way Doherty amplifier 10 for amplifying a modulated or non-modulated carrier signal. The carrier signal may have a carrier frequency in the range of e.g., 0.5 to 10 gigahertz. The modulated carrier signal may be a wideband signal. That is, it may have a non-negligible relative bandwidth in the range of, e.g., 10% to 35%. The spectral range occupied by the carrier signal may be the range of frequencies from F0−B/2 to F0+B/2, where F0 is the carrier frequency and B is the bandwidth. The carrier signal may carry a modulating baseband signal. The baseband signal may be an analog or digital signal.

A first amplifier output line 20 may connect the first amplifier output node 16 to a combining node 24. A second amplifier output line 22 connecting the second amplifier output node 18 to the combining node 24. The combining node 24 may be connected or connectable to a load 26. The load 26 may, for example, comprise an impedance transformation network or an antenna or both. The antenna may be driven by the carrier signal to emit an electromagnetic wave (not shown).

The Doherty amplifier may further comprise a ground node 28 for providing a ground or reference voltage. The ground node may, for instance, be implemented in the form of a metal flange, plate, or other kind of extended conductor. The carrier signal at various nodes in the amplifier 10, e.g., at the first amplifier output node 16, the second amplifier output node 18, and at the combining node 24, may be the local voltage at the respective node relative to the ground voltage.

The first amplifier 12 may be a main amplifier, and the second amplifier 14 may be a peak amplifier. The peak amplifier may have a gain that is identical to or smaller or larger than the gain of the main amplifier. The peak amplifier may notably have a lower gain due to operation in C-class. The main amplifier may, for example, be operated in AB-class. The peak amplifier, e.g., the second amplifier 14, may be arranged to be switched on automatically when the main amplifier, e.g., the first amplifier 12, is saturated or close to saturation. The peak amplifier may be switched off automatically when the main amplifier 12 is below the saturation power level.

The first amplifier 12 and the second amplifier 14 may be of the same or different build or technology and thus have the same or different operating characteristics. For instance, the first amplifier 12 and the second amplifier 14 may have the same output impedance. The output impedance of the first amplifier 12 may be the impedance between the output node 16 and the ground node 28. Similarly, the output impedance of the second amplifier 14 may be the impedance between the output node 18 and the ground node 28. A first capacitor 30 and a first inductor 32 may be connected between the first amplifier output node 16 and the ground node 28 to achieve an output impedance of the first amplifier 12 that has a desired value. The capacitor 30 may be a parasitic output capacitor or an additional capacitor if required. Similarly, a second capacitor 34 and a second inductor 36 may be connected between the second amplifier output node 18 and the ground node 28. The capacitors and inductors 30, 32, 34, and 36 are not necessarily provided in form of dedicated electronic components but may represent internal properties of the first amplifier 12 and the second amplifier 14.

The electrical length of a transmission line may be defined as the integral over the local wavelength of the transmitted harmonic signal along the transmission line, divided by the geometrical length of the transmission line. The first amplifier output line 20 may have an electrical length of substantially one quarter wavelength of the carrier signal. The second amplifier output line 22, in contrast, may have an electrical length of substantially one half wavelength of the carrier signal. As a result, the output impedance Zm of the first amplifier 12 (first output impedance) and the output impedance Zp of the second amplifier 14 (second output impedance) may have an opposite frequency dependence. The frequency variation of Zm and the frequency variation of Zp may therefore compensate each other at the combining node 24. Consequently, the output impedance of the Doherty amplifier may have a reduced frequency dependence at least within a certain frequency range centered at the carrier frequency F0. Distortions of the carrier signal by the Doherty amplifier 10 may therefore be reduced due to better matching of phase and amplitude of the combined signals along the operational frequency band.

Figure 2A:
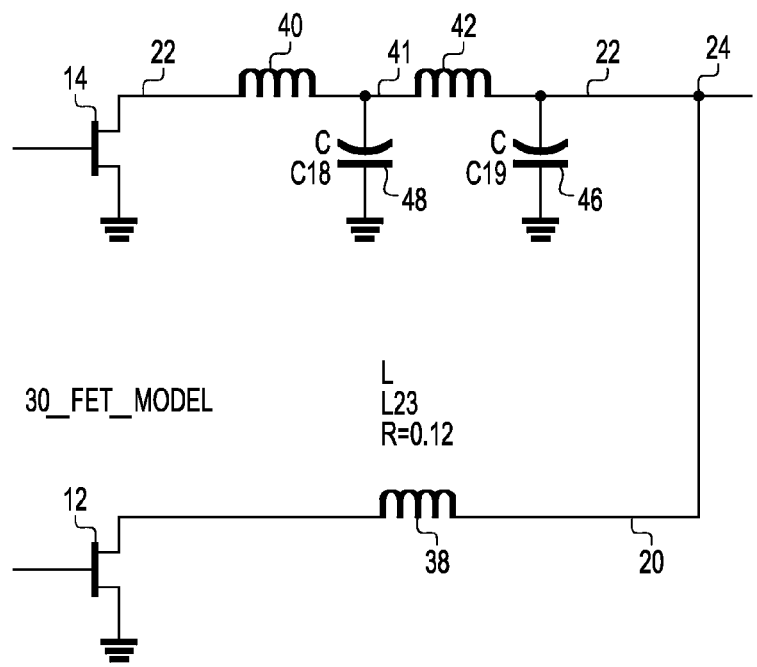
FIG. 2a shows a circuit diagram of an example of an embodiment Doherty amplifier.

FIG. 2 shows a lumped element circuit diagram that may be equivalent to the one of FIG. 1, where for wideband operation and simplicity output parasitic capacitances Cds of devices 12 and 14 have values so that their impedance may be equal to an optimal load impedance $(1/\omega*Cds)=Zopt$ of the device, where w is the angular frequency $2*\pi*F0$. In the present example, the first amplifier 12 and the second amplifier 14 are each implemented by a transistor, e.g., a field effect transistor. The first amplifier output line 20 may comprise a wire 38 having an inductance value L so that $Zopt=\omega L$, which with Cds of the device 12 will provide an electrical length of 90° or one quarter wavelength, while the second amplifier output line 22 may comprise two wires 40 and 42 in series and shunt capacitances 46 and 48, allowing all together an electrical length of (2×90°)=180° or half-wavelength in accordance to electrical circuit theory. Those experienced with RF design theory will understand that this configuration is not the only one possible, and that even better performance may be achieved for these networks if they use not a 90° Low-Pass prototype LC equivalents but twice as many 45° LC chains, as this may allow for a much more uniform characteristic impedance and more linear phase characteristic within the operational frequency band. It also should be mentioned that if the Cds value accedes a required one, a compensation shunt inductance may be needed, e.g., as elements 32 and 36 in FIG. 1. The available operational frequency bandwidth may then be somewhat reduced.

Figure 3:
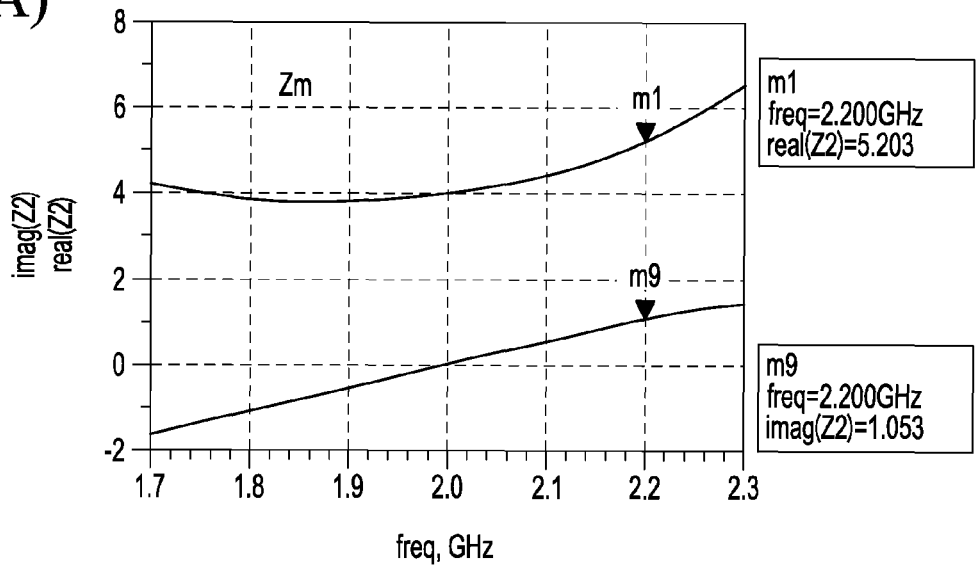
FIG. 3 schematically shows a frequency dependence of an output impedance of the main amplifier and the peak amplifier, respectively.
Figure 3:
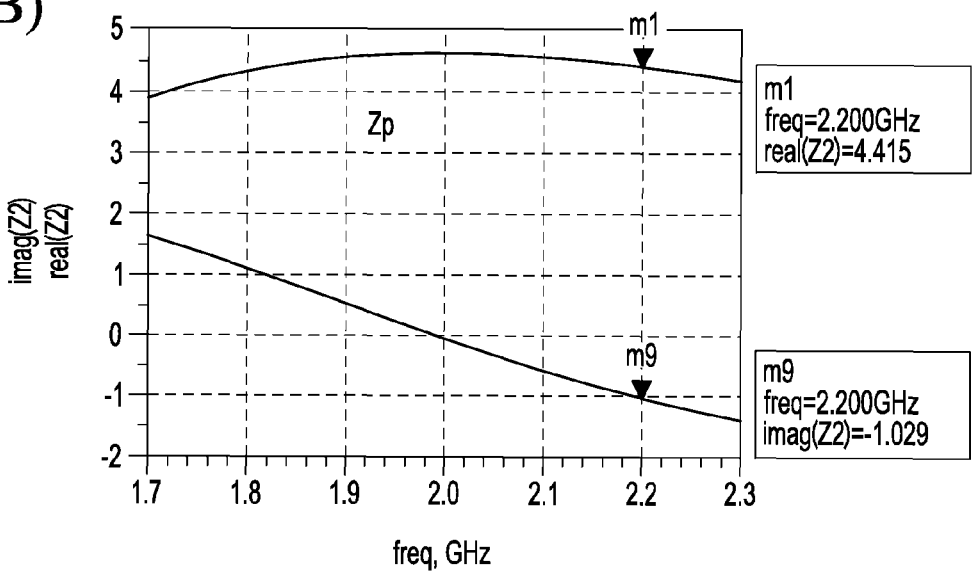

Referring now to FIG. 3, an example of a frequency variation of the first output impedance Zm (plot A) and a corresponding frequency variation of the second output impedance Zp (plot B) is illustrated. In this example, the carrier frequency is, e.g., two gigahertz. The combining network which connects the first amplifier 12 and the second amplifier 14 to the combining node 24, i.e., the network comprising the first amplifier output line 20 and the second amplifier output line 22, is designed such that the real parts of Zm and Zp may both be non-zero and of different value at the center of the operational frequency band, while the imaginary parts of Zm and Zp may both be zero for the same frequency (two gigahertz in the present example). As seen in plot B, the second output impedance Zp exhibits a variation in frequency that is approximately opposite to the frequency variation of the first output impedance Zm shown in plot A.

The resulting combined impedance Z of the symmetrical Doherty amplifier 10 may be constant over frequency with the real part Re(Z)=0.5*Re(Zm) and the imaginary part Im (Z) virtually close to zero in the whole frequency band.

Figure 4:
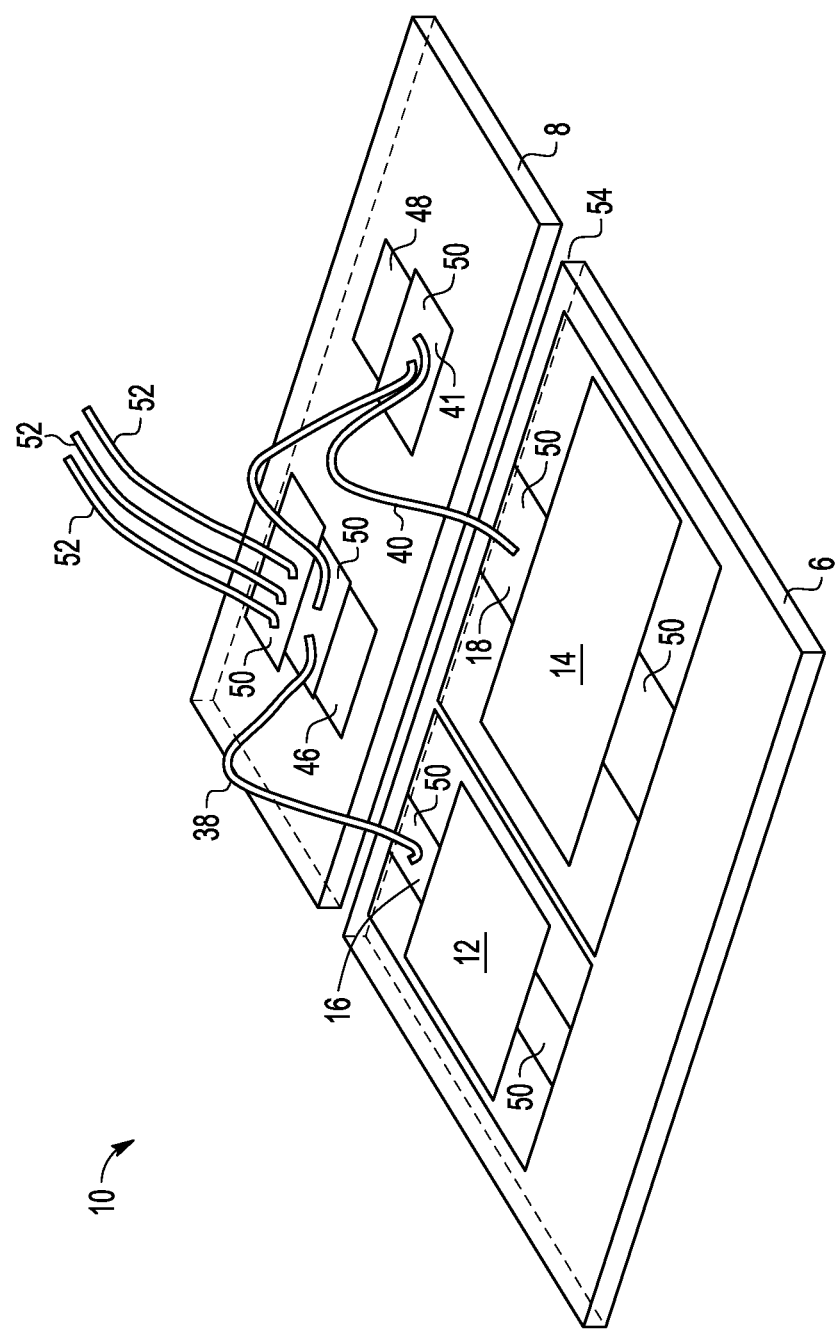
FIG. 4 schematically shows an example of an embodiment of a Doherty amplifier.

FIG. 4 provides a schematic perspective view of an example of a Doherty amplifier 10. The Doherty amplifier 10 may comprise a first substrate 6 and a second substrate 8. The first amplifier 12 and the second amplifier 14 may be arranged on the first substrate 6. The combining node 24 may be arranged on the second substrate 8. The substrates 6 and 8 may be made of different materials. For example, the first substrate 6 may be made of a LDMOS substance. The substance may be heavily doped and therefore introduces high RF losses. For example, there may be non-negligible Foucault currents when the amplifier 10 is operated. The substrate 8, on the other hand, may be made of a low loss material, e.g., a material having a higher electrical resistance than the material of the first substrate 6. The second substrate 8 may, for example, comprise or be made of a high resistivity substrate like, e.g., GaAs or a gallium nitride compound, for achieving low losses at radio-frequency (RF).

In the shown example, the output node 16 of the first amplifier 12 may be connected to the combining node 24 via the wire 38 (see FIG. 2) and bond pads 50. Similarly, the output node 18 of the second amplifier 14 may be connected to the combining node 24 by means of the two wires 40 and 42 connected in series and via bond pads 50. The intermediate node 41 (see FIG. 2) may be provided by a bond pad 50 located on the second substrate 8.

The proposed layout in FIG. 4 is chosen to minimize an undesired interaction of the carrier signal travelling in the two amplifier output lines 20 and 22 (provided by, e.g., wires 38, 40, and 42) and the lossy substrate 6 that carries the first amplifier 12 and the second amplifier 14.

The second substrate 8 may have a dielectric constant that is lower or higher if appropriate than the dielectric constant of the first substrate 6, so required physical dimensions may be achieved for electrical wavelengths of the carrier signal in the second substrate 8 may thus be achieved which may facilitate the production of amplifier output lines 20 and 22 having the desired lengths of one quarter wavelength and one half wavelength, respectively.

The Doherty amplifier output network 10 may further comprise one or more wires 52 for connecting the combining node 24 to the load 26.

Figure 5:
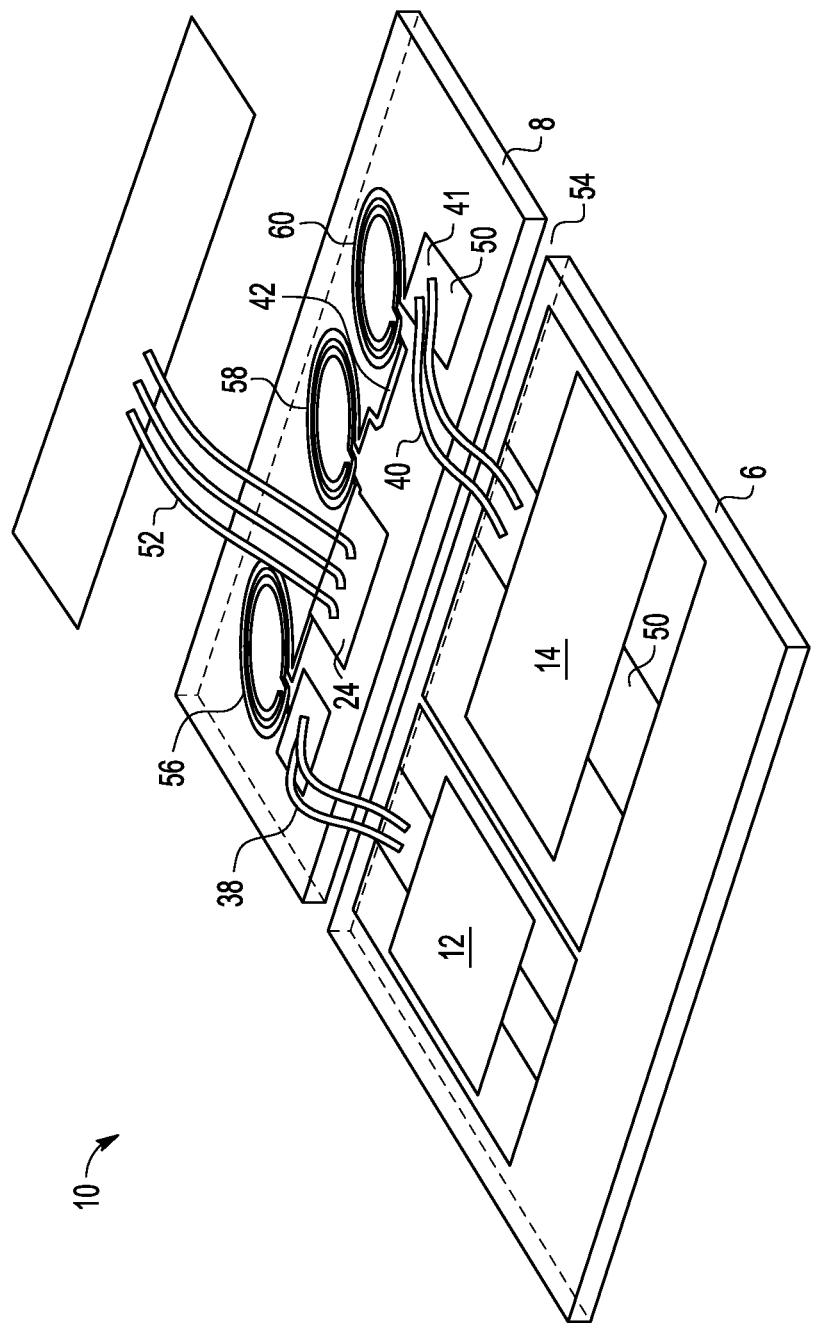
FIG. 5 schematically shows another example of an embodiment of a Doherty amplifier.
Figure 6:
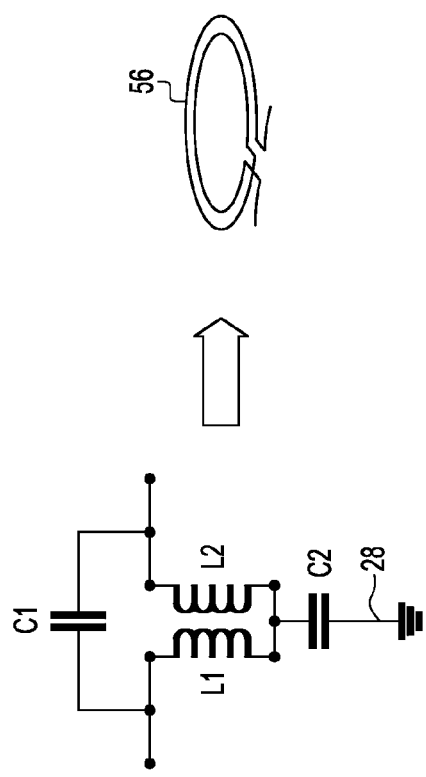
FIG. 6 schematically shows an example of a phase shift network comprising coupled coils and a corresponding circuit diagram.
Figure 7:
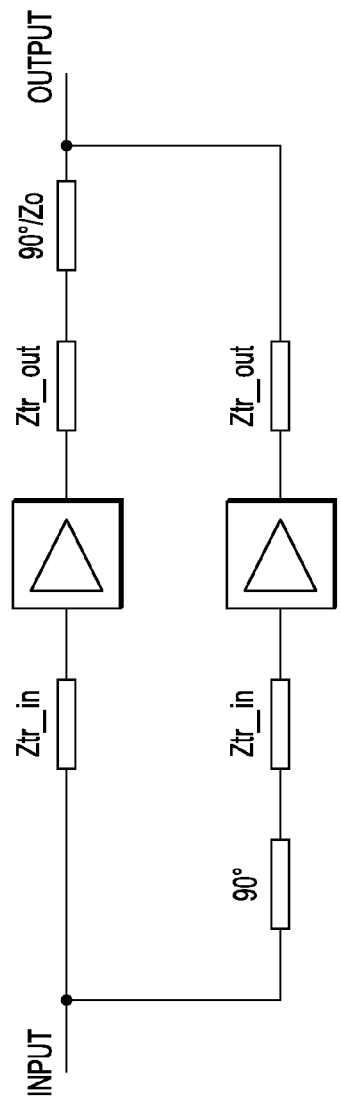
FIG. 7 schematically shows an example of an embodiment of a state of the art Doherty amplifier.
Figure 8:
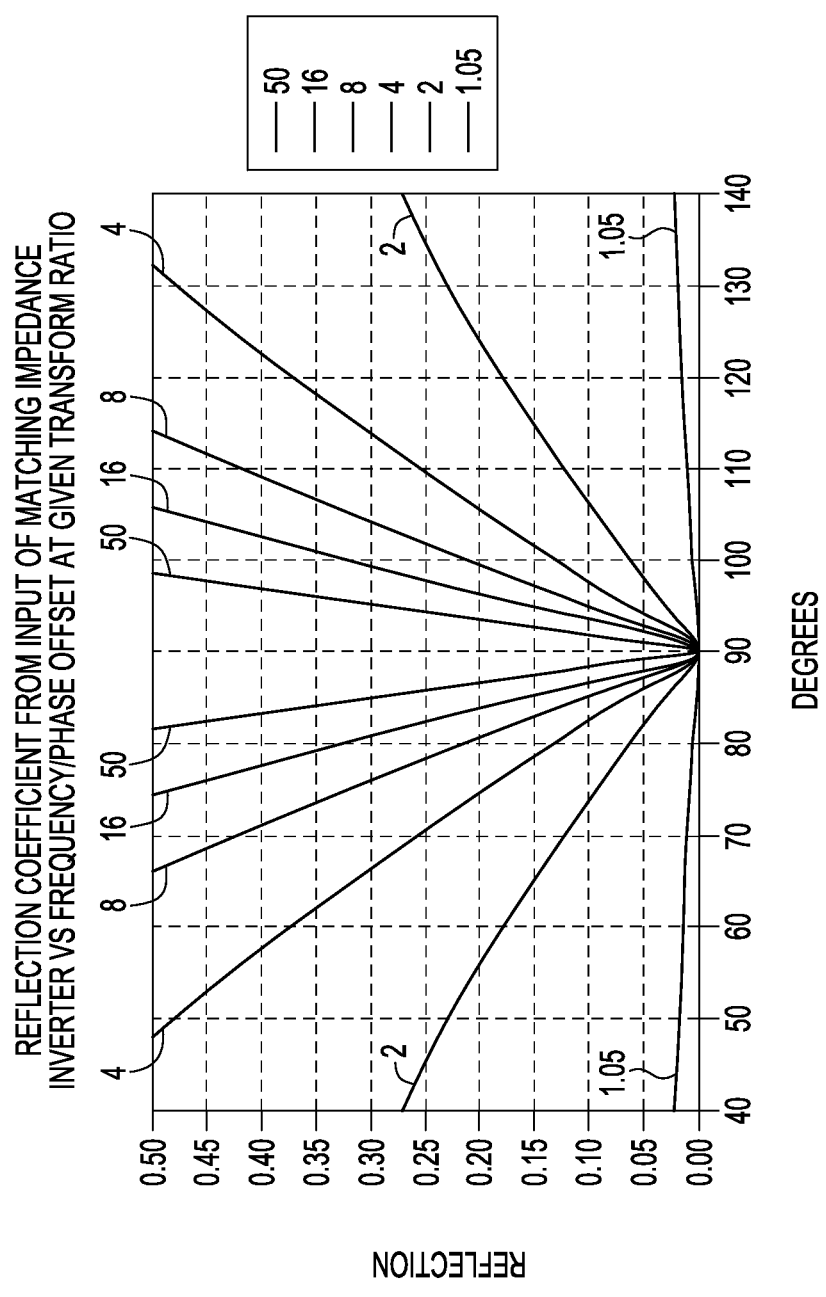
FIGS. 8 and 9 show graphs of a reflection coefficient versus phase and frequency observed in an example of an embodiment of a Doherty amplifier, for different transformation ratios.
Figure 9:
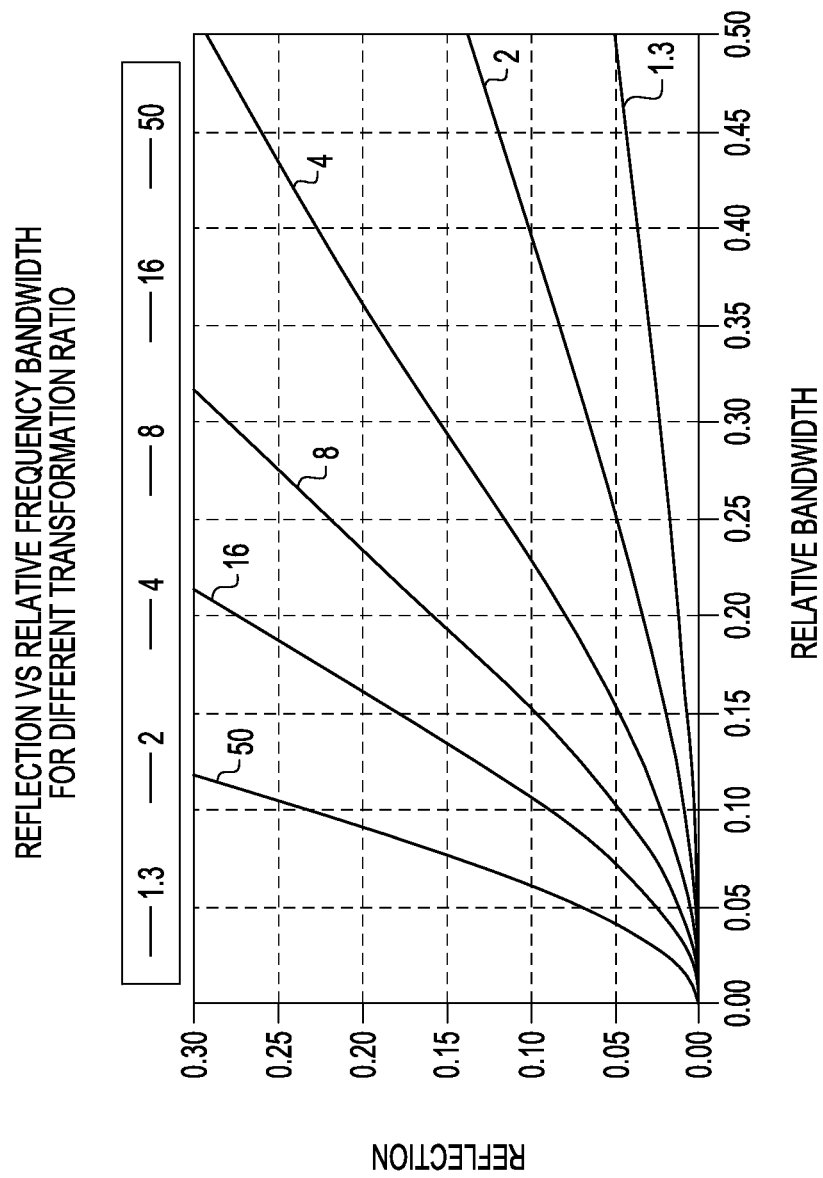
Figure 10:
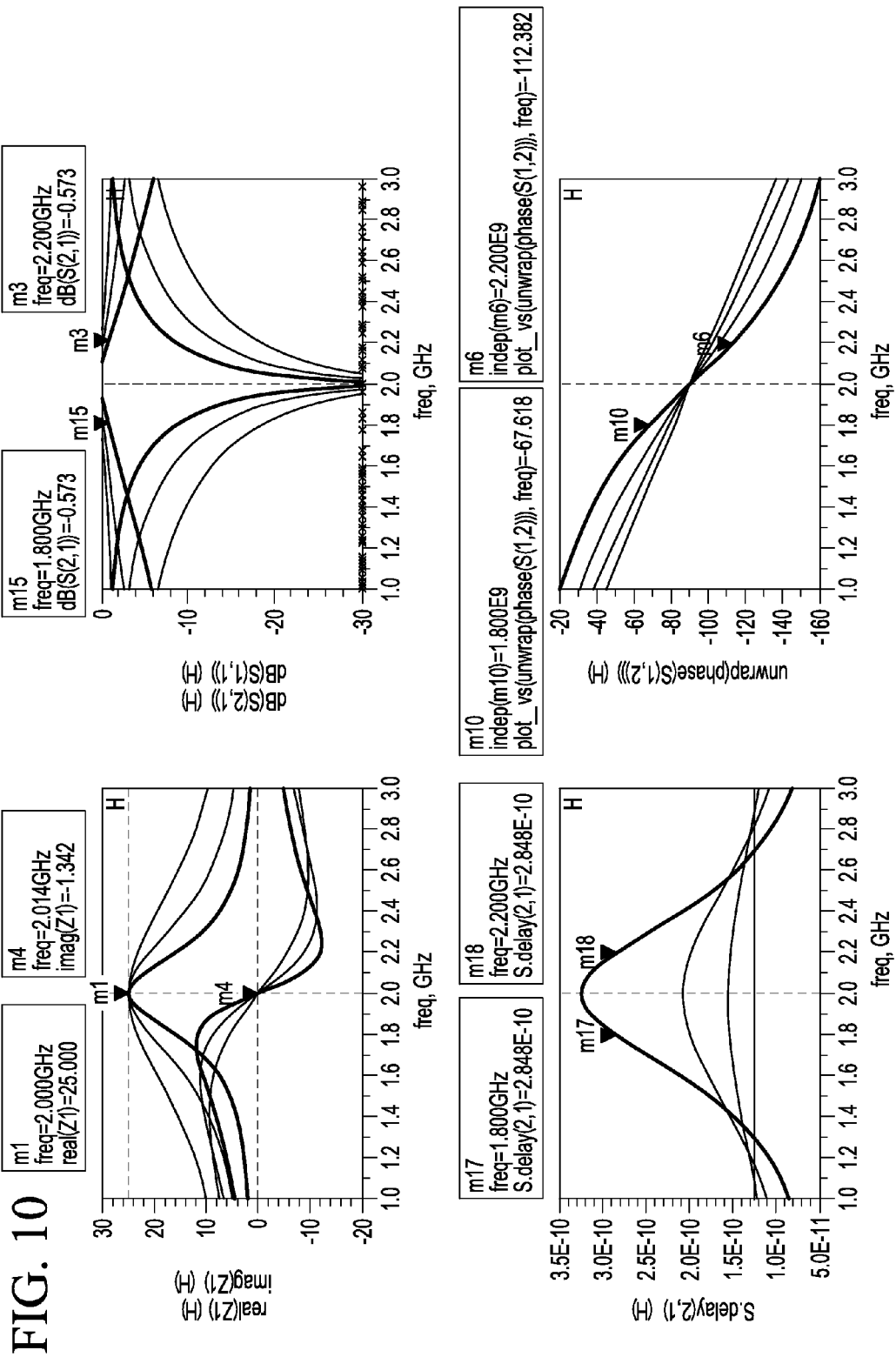
FIG. 10 illustrates effects of distortions of phase characteristic and group delay responses due to modulation of impedance by an ideal impedance inverter or Doherty combiner.
Figure 11:
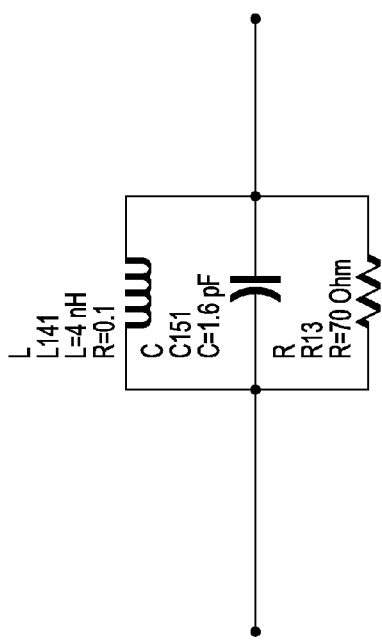
FIGS. 11 and 12 shows an example of a corrector of a group delay characteristic and correction characteristic versus distortions.
Figure 12:
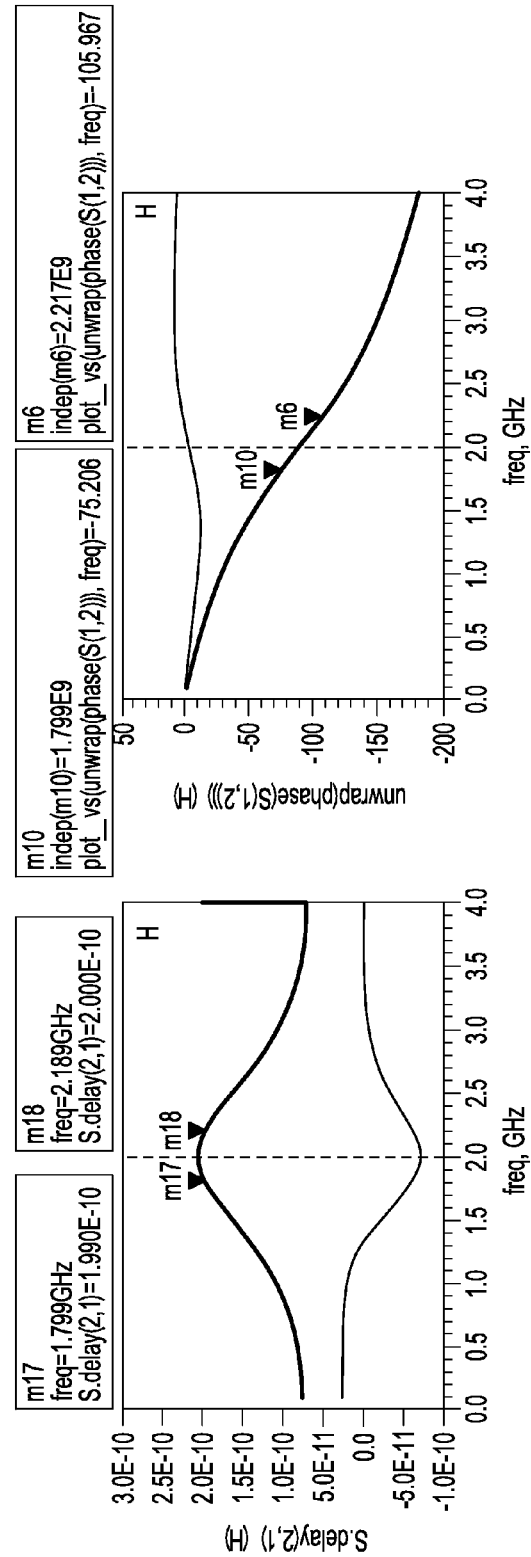

FIGS. 5 and 6 illustrate another example of a Doherty amplifier 10 which differs from the one shown in FIG. 4 in that the desired electrical lengths of the amplifier output lines 20 and 22 may be achieved by means of one or more microcoils 56, 58, and 60, for example. The microcoils may be arranged on or integrated in the second substrate to minimize losses. In the shown example, a first microcoil 56 may be connected between the first wire 38 and the combining node 24. A second coil 58 and a third coil 60 may be connected in series between the intermediate node 41 and the combining node 24. The wires 38, 40, and 42 may in this example have electrical lengths that may be negligible compared to the electrical lengths of the microcoils 56, 58, and 60. For example, each microcoil may have an electrical length of one quarter wavelength of the carrier signal.

Between the first substrate 6 and the second substrate 8, there may be an air gap 54 for further minimizing any influence of the first substrate 6 on the carrier signal in the amplifier output lines 20 and 22.

It is pointed out that a large variety of options exists for implementing a conductor or transmission line that has a desired electrical length. The examples of the output lines 20 and 22 described herein are therefore only examples.

Figure 2B:
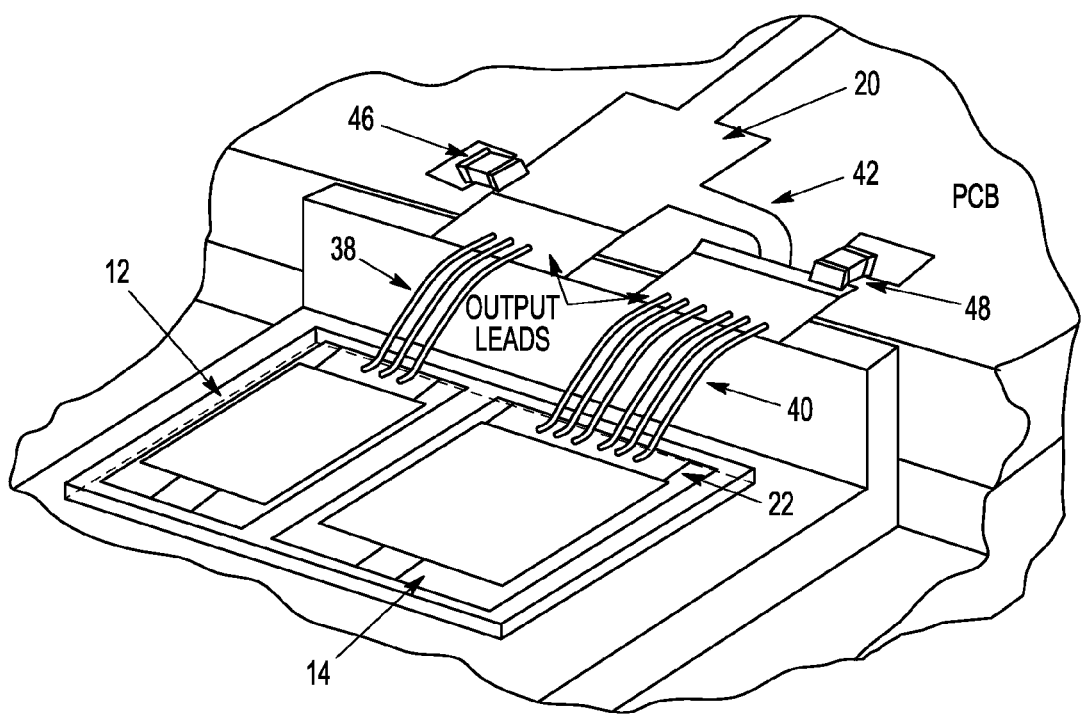
FIG. 2b provides a perspective schematic partial view of an example of an embodiment of a Doherty amplifier.

One of the most valued parameters of power amplifiers for mobile communications among others is a low cost. Such a device in plastic packages, especially Monolithic Microwave Integrated Circuits (MMIC) with a high integration level, including several amplification stages allowing high gain, may become a major option for transmitters of Base Transceiver Stations (BTS or Base Stations) for Mobile Communication Systems. FIG. 2b shows another example of a wideband Doherty combiner. Some of its components may be implemented outside of a low cost plastic package of a high gain MMIC. This solution may be suitable for Doherty amplifiers operating at a lower frequencies, e.g., below 3 GHz. This solution can solve a problem of combining a high gain MMIC at output with a Doherty combiner, which may be arranged outside of package. Bond wires for connecting the output of the MMIC to the leads of the package may be incompatible with the desired wideband operation of a state-of-the-art low-pass CLC Doherty combiner. This is due to the fact that in this case the combining point of the main and peak amplifiers is separated with parasitic inductance, connected between the output of the peak device and the lead, the expected point of power combination, which may destroy network operation.

Figure 13:
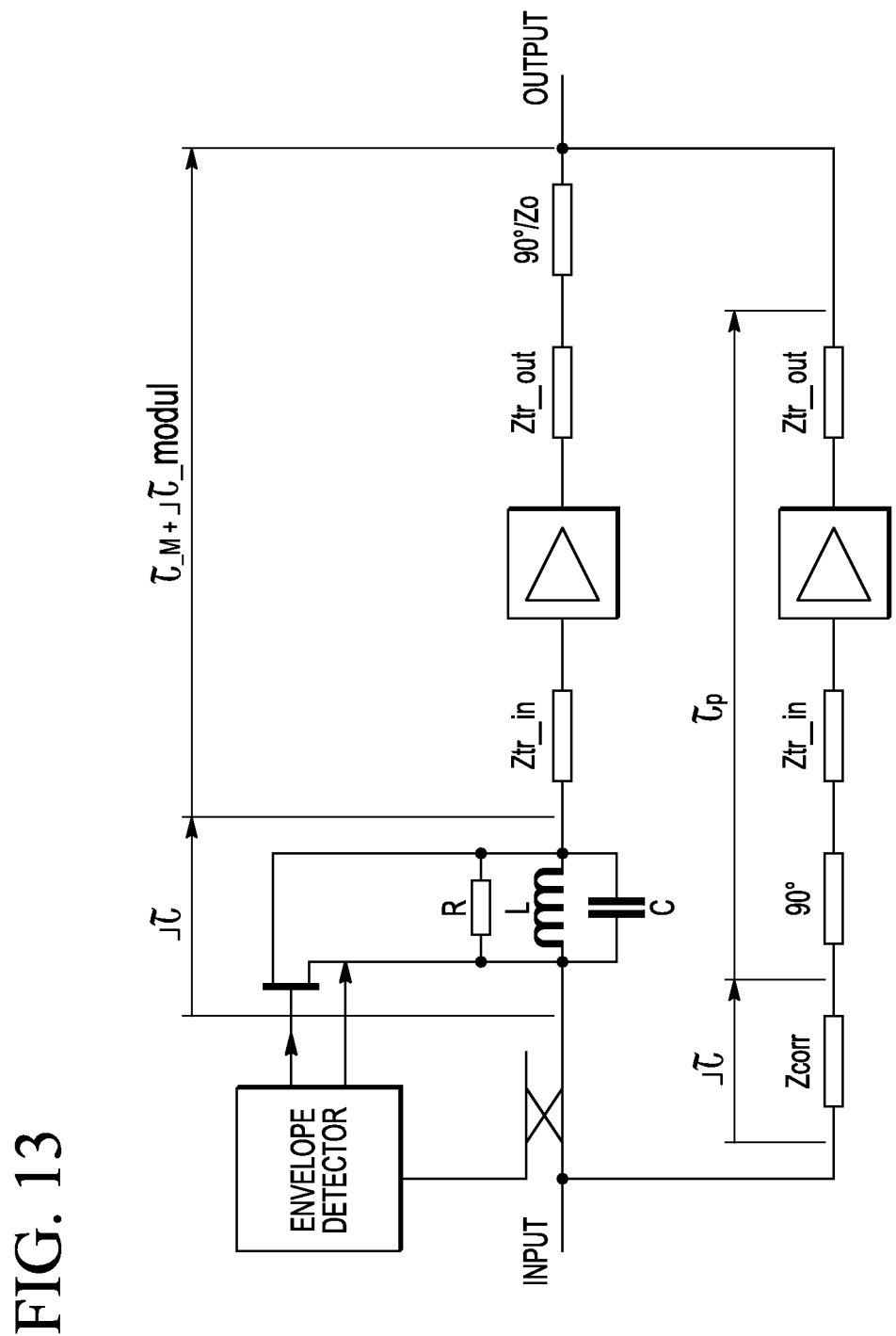
FIG. 13 shows an exemplary schematic of a Doherty amplifier with an implementation of a dynamic correction of group delay and AM-PM distortions.
Figure 14:
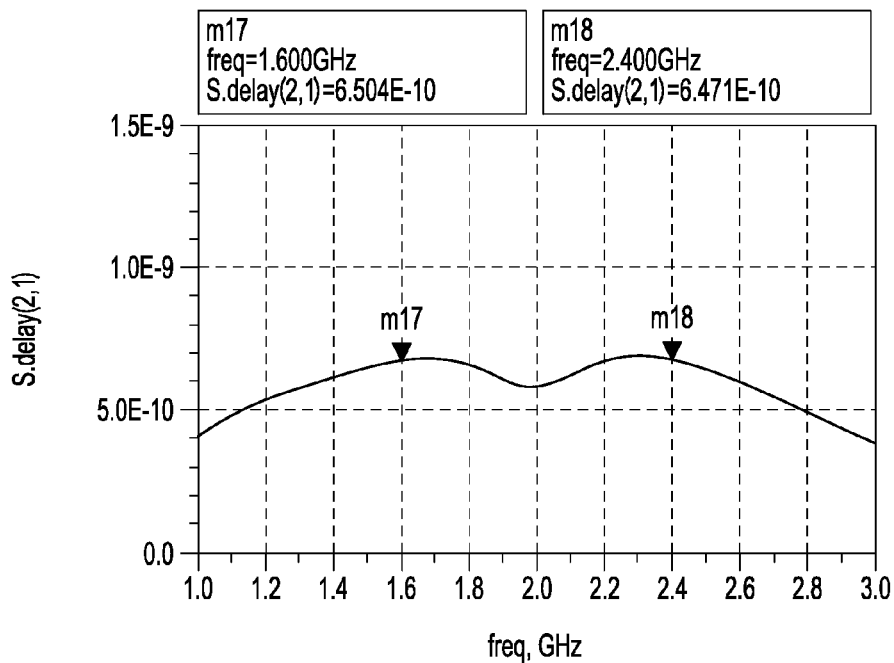
FIGS. 14 to 17 illustrate a simulation of a dynamic correction of the group delay in an example of a conventional Doherty amplifier as shown in FIG. 13.
Figure 15:
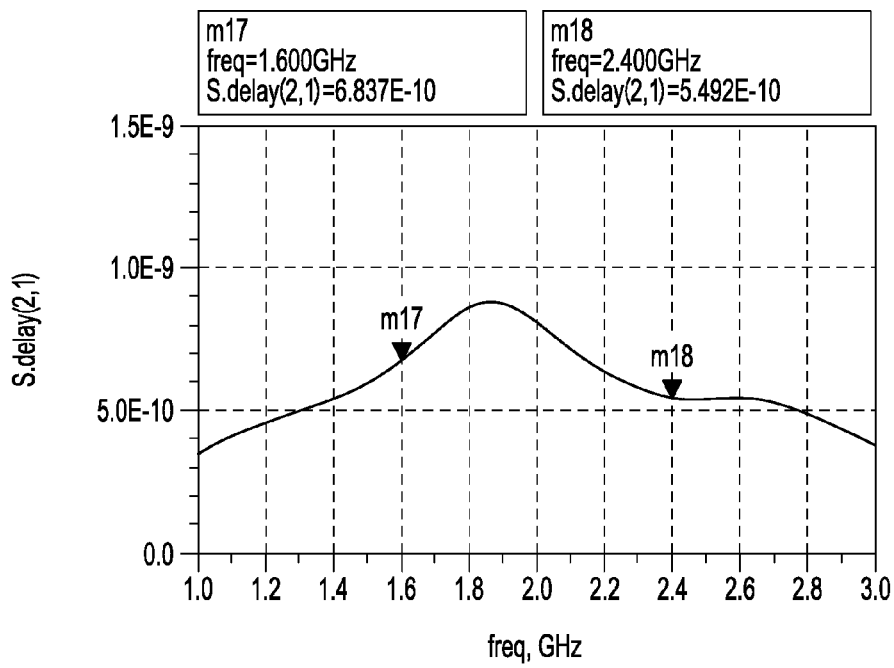
Figure 16:
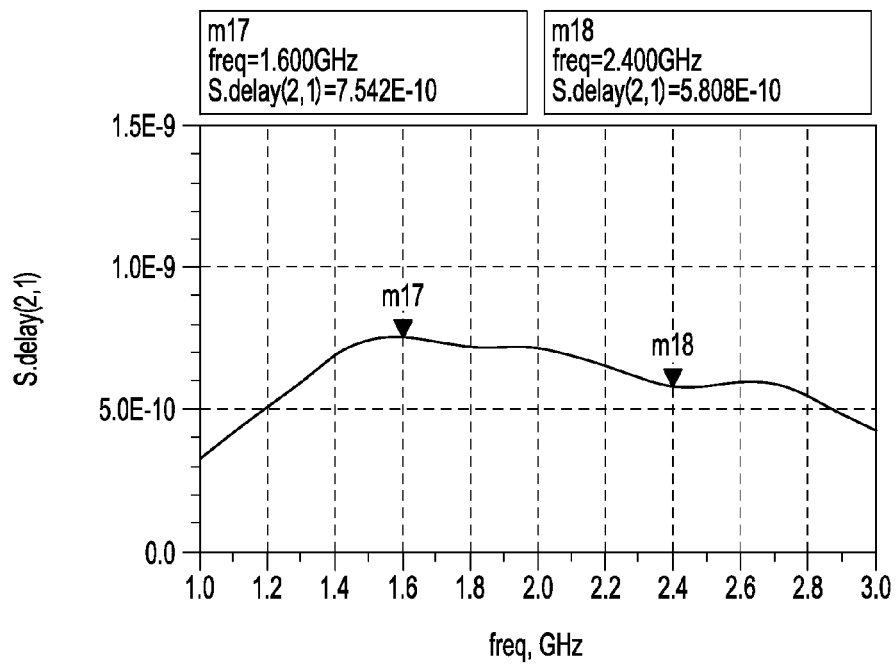
Figure 17:
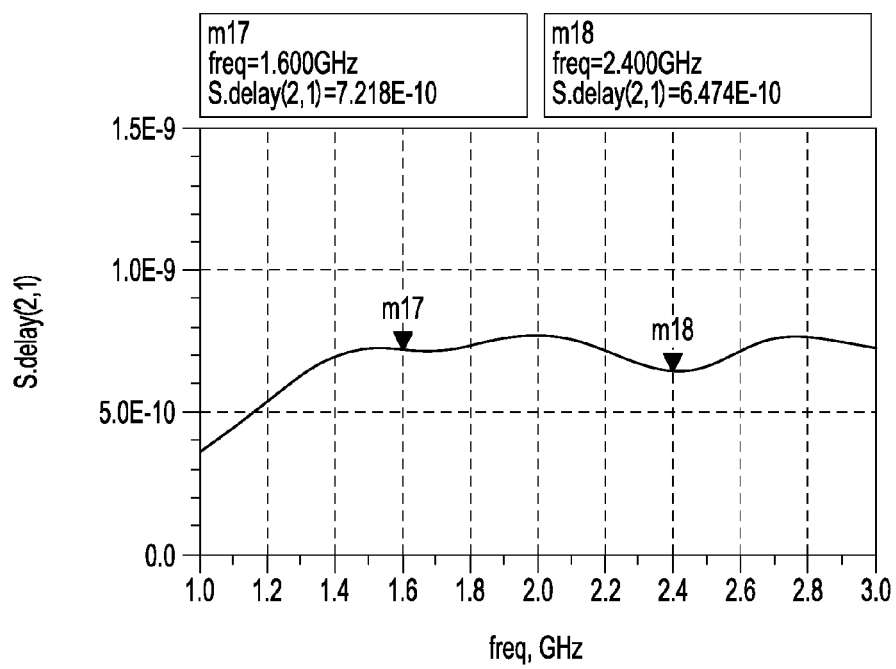

FIGS. 14 to 16 illustrate, step by step, the dynamic correction of group delay in an example of a conventional Doherty amplifier as shown in FIG. 13, in accordance with a simulation. FIG. 14 shows the group delay of the Doherty amplifier at peak power level, where the Doherty combiner is matched at both ends so that Zo equals Zload. In this example, Zo=Zload=50 Ohm. FIG. 15 shows the group delay of the Doherty amplifier at Pout<Pavr, where the Doherty combiner is mismatched at output with Zo>Zload=25 Ohm. FIG. 16 shows the group delay at Pout<Pavr with the group delay corrector at the input of the main amplifier. FIG. 17 shows the group delay at Pout<Pavr with a short compensation line added at the input of the peak amplifier.

In the foregoing specification, the invention has been described with reference to specific examples of embodiments of the invention. It will, however, be evident that various modifications and changes may be made therein without departing from the broader spirit and scope of the invention as set forth in the appended claims.

For example, the semiconductor substrate described herein can be any semiconductor material or combinations of materials, such as gallium arsenide, silicon germanium, silicon-on-insulator (SOI), silicon, monocrystalline silicon, the like, and combinations of the above.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although specific conductivity types or polarity of potentials have been described in the examples, it will be appreciated that conductivity types and polarities of potentials may be reversed.

Also for example, in one embodiment, the illustrated examples may be implemented as circuitry located on a single integrated circuit (IC) or within a same device. For example, the components 12 to 48 may be located in a single IC. Alternatively, the examples may be implemented as any number of separate integrated circuits or separate devices interconnected with each other in a suitable manner. For example, some components may be arranged on a first substrate, while other may be arranged on a second substrate, e.g., as described with reference to FIGS. 4 and 5.

Also for example, the examples, or portions thereof, may implemented as soft or code representations of physical circuitry or of logical representations convertible into physical circuitry, such as in a hardware description language of any appropriate type.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A two-way Doherty amplifier comprising:
a first amplifier having a first amplifier output node;
a second amplifier having a second amplifier output node;
a combining node configured to be coupled to a load;
a first amplifier output line coupling the first amplifier output node to the combining node; and
a second amplifier output line coupling the second amplifier output node to the combining node, wherein
the first amplifier output line has an electrical length of substantially one quarter wavelength of a carrier signal, and the first amplifier output line includes a first inductance that is selected from a wire and a microcoil, and a first shunt capacitance coupled between the first inductance and a ground node,
the second amplifier output line has an electrical length of substantially one half wavelength of the carrier signal, the second amplifier output line includes a second inductance and a third inductance coupled in series with an intermediate node between the second and third inductances, the second inductance and the third inductance each is selected from a wire and a microcoil, and the second amplifier output line further includes second and third shunt capacitances coupled between the second and third inductances and the ground node, and
the carrier signal is one of modulated or non-modulated.

2. The Doherty amplifier of claim 1, wherein the first amplifier is a main amplifier and the second amplifier is a peak amplifier, or vice versa.

3. The Doherty amplifier of claim 1, wherein the first amplifier and the second amplifier are of the same build.

4. The Doherty amplifier of claim 1, further comprising the ground node for providing a reference voltage, wherein the carrier signal in each of said first amplifier output node, said second amplifier output node, and said combining node is represented by the local voltage at the respective node relative to said reference voltage.

5. The Doherty amplifier of claim 1 further comprising a first substrate and a second substrate, wherein the first amplifier and the second amplifier are arranged on the first substrate and the combining node is arranged on the second substrate.

6. The Doherty amplifier of claim 5, wherein the first substrate is made substantially of a first material, the second substrate is made substantially of a second material, and the second material has a lower electrical conductivity than the first material.

7. The Doherty amplifier of claim 5, wherein there is an air gap between the first substrate and the second substrate and wherein the first amplifier output line and the second amplifier output line bridge the air gap.

8. The Doherty amplifier of claim 1, wherein the first inductance comprises a wire that couples the first amplifier output node to the combining node wherein the wire has an inductance that, in conjunction with an output parasitic capacitance, provides a characteristic impedance and a phase shift of the carrier signal of less than 90° or an electrical length shorter than approximately one quarter wavelength at most.

9. The Doherty amplifier of claim 1, wherein:
the second inductance comprises a first wire; and
the third inductance comprises a second wire, wherein
the first wire connects the second amplifier output node to the intermediate node,
the second wire connects the intermediate node to the combining node, and
the first wire and the second wire each have inductances, which in conjunction with an output parasitic capacitance and capacitances of bond-pads provide a characteristic impedance and an overall 180° phase shift or an electrical length of approximately one half-wavelength of the carrier signal.

10. The Doherty amplifier of claim 9, further comprising a first substrate and a second substrate, wherein the second amplifier output node is arranged on the first substrate and the combining node is arranged on the second substrate.

11. The Doherty amplifier of claim 1, wherein
the first inductance comprises a first microcoil,
the second inductance and the third inductance comprise a second microcoil and a third microcoil,
the second microcoil and the third microcoil are connected in series, and
the first, second, and third microcoils each provide a characteristic impedance and equivalent electrical length of approximately one quarter wavelength of the carrier signal.

12. The Doherty amplifier of claim 1, wherein the carrier signal has a frequency that is above 500 megahertz.

13. The Doherty amplifier of claim 1, wherein the first amplifier and the second amplifier are high gain Monolithic Microwave Integrated Circuit amplifiers arranged inside a low cost plastic package with their outputs connected to separate leads by inductances and, and wherein components are arranged outside the package on a printed circuit board.

14. A two-way Doherty amplifier comprising:
a first amplifier having an input and a first amplifier output node;
a second amplifier having a second amplifier output node, wherein the first amplifier is a main amplifier and the second amplifier is a peak amplifier, or vice versa;
a combining node configured to be coupled to a load;
a first amplifier output line coupling the first amplifier output node to the combining node;
a second amplifier output line coupling the second amplifier output node to the combining node; and
a group delay corrector coupled to the input of the main amplifier, wherein a phase or group delay characteristic frequency response in an operational frequency band has a character opposite to one generated by an impedance inverter or Doherty combiner connected to the second amplifier output node, and wherein
the first amplifier output line has an electrical length of substantially one quarter wavelength of a carrier signal,
the second amplifier output line has an electrical length of substantially one half wavelength of the carrier signal, and
the carrier signal is one of modulated or non-modulated.

15. The Doherty amplifier of claim 14, wherein the group delay corrector includes an inductive element, a capacitive element and a resistive element connected in parallel to each other and in series with an input of the main amplifier.

16. A two-way Doherty amplifier comprising:
a first amplifier having a first amplifier output node;
a second amplifier having a second amplifier output node, wherein the first amplifier and the second amplifier are high gain Monolithic Microwave Integrated Circuit amplifiers arranged inside a plastic package with their outputs connected to separate leads by inductances;
a combining node coupled to a load;
a first amplifier output line coupling the first amplifier output node to the combining node, wherein the first amplifier output line has an electrical length of substantially one quarter wavelength of a carrier signal, and the carrier signal is one of modulated or non-modulated;
a second amplifier output line coupling the second amplifier output node to the combining node, wherein the second amplifier output line has an electrical length of substantially one half wavelength of the carrier signal; and
a group delay corrector coupled to an input of the first amplifier, wherein the group delay corrector includes an inductive element, a capacitive element and a resistive element connected in parallel, and wherein a first end of the group delay corrector is connected to an input of the first amplifier and a second end of the group delay corrector is connected to a reference node.

17. The Doherty amplifier of claim 16, further comprising a voltage-controlled resistive component for controlling a Q factor of the group delay corrector, wherein the resistive component is connected in parallel to the group delay corrector.

18. The Doherty amplifier of claim 17, wherein the voltage-controlled resistive component is a field-effect transistor, a metal-oxide-semiconductor field-effect transistor, or a pseudomorphic high electron mobility transistor.

19. The Doherty amplifier of claim 16, further comprising an envelope detector for controlling the group delay corrector.

20. The Doherty amplifier of claim 16, wherein an additional phase shift or a delay is provided by an additional transmission line at the input of the second amplifier which is approximately equal to that introduced by the group delay corrector connected at the input of the first amplifier at or close to a peak power level of the Doherty amplifier.

* * * * *